United States Patent

Nowak et al.

[11] Patent Number: 5,302,422
[45] Date of Patent: Apr. 12, 1994

[54] DEPOSITION PROCESS OF A CERAMIC COATING ON A METALLIC SUBSTRATE

[75] Inventors: Jean-Francois Nowak, Saint Etienne; Francis Maury, Labege; Djarollah Oquab, Toulouse Cedex; Roland Morancho, Toulouse, all of France

[73] Assignees: Nitruvid, Argenteuil; C3F (Compagnie Francaise de Forges et Fonderies), Puteaux, both of France

[21] Appl. No.: 975,999

[22] Filed: Nov. 13, 1992

Related U.S. Application Data

[63] Continuation of Ser. No. 479,676, Feb. 15, 1990, abandoned.

[30] Foreign Application Priority Data

Feb. 16, 1989 [FR] France .................. 89 02048

[51] Int. Cl.⁵ .................. B05D 3/06; C23C 16/00
[52] U.S. Cl. .................. 427/533; 427/532; 427/528; 427/248.1; 427/314; 427/327
[58] Field of Search .............. 427/309, 327, 528, 532, 427/533, 314, 248.1

[56] References Cited

U.S. PATENT DOCUMENTS

| | | |
|---|---|---|
| 3,474,017 | 10/1969 | Werner . |
| 4,605,566 | 8/1986 | Matsui et al. .................. 427/43.1 |
| 4,810,530 | 3/1989 | D'Angelo et al. .................. 427/215 |
| 4,873,117 | 10/1989 | Hertz et al. .................. 427/37 |
| 4,959,242 | 9/1990 | Itoh .................. 427/38 |

FOREIGN PATENT DOCUMENTS

| | | |
|---|---|---|
| 055459A1 | 7/1982 | European Pat. Off. . |
| 64-65251 | 3/1989 | Japan .................. 427/126.1 |
| 397370 | 10/1977 | Sweden . |
| 1032828 | 6/1966 | United Kingdom . |

OTHER PUBLICATIONS

Ryabova, "Thin films from organometallic compounds" Chapt. 5 North-Holland Publishing Co. 1981 (pp. 618–621 and 636).
STREM Chemicals, Inc. Catalog No. 13, 1989 p. 22.
Chemical Abstracts, vol. 89, Nov. 22, 1978, p. 252.
Plating vol. 53, No. 6, Jun. 1966, pp. 772–782.
J. E. Knap et al "Vapor Plating with Dicumenechromium Preparation and Properties of the Chromium Plate".

*Primary Examiner*—Roy V. King

[57] ABSTRACT

The object of the present invention is a deposition process of a coating of the ceramic type based on carbides, nitrides, or carbonitrides of metallic elements such as Cr, V, Zr, W, Mo, Co, Mn, Ni, Hf, Ta, Ti, Nb and Fe in which the coating of the ceramic type is deposited at low temperature in the vapour phase on a metallic substrate from organo-metallic precursors wherein, prior to this deposition in the vapour phase and without subsequent placing in contact with an oxidizing and/or polluting atmosphere, a reactive ionic pickling is carried out in a reducing atmosphere.

12 Claims, 2 Drawing Sheets

DEPOSITION PROCESS OF A CERAMIC COATING ON A METALLIC SUBSTRATE

This is a continuation of Application No. 07/479,676, filed on Feb. 15, 1990, now abandoned.

The present invention relates to a deposition process of a coating of the ceramic type based on carbides, nitrides or carbonitrides of metallic elements such as Cr, V, Zr, W, Mo, Co, Mn, Ni, Hf, Ta, Ti, Nb and Fe in which the coating of the ceramic type is deposited at low temperature in the vapour phase onto a metallic substrate from organo-metallic precursors.

In FR-2 439 824, a process of chromization of a steel in the gas phase has already been described comprising three successive treatments, namely an ionic nitriding in a mixture of nitrogen and hydrogen at a temperature of 450° to 550° C., a chromization in the gas phase starting from a mixture of ferro-chromium and ammonium chloride at a temperature of 850° to 1100° C. and a thermal treatment comprising an oil quenching and tempering at a temperature of 600° to 650° C.

In this process, the successive treatments are carried out in different installations.

Furthermore, in this process the nitriding layer serves exclusively as a nitrogen reservoir which back-diffuses towards the surface during the chromization deposition step at high temperature to participate in the formation of carbonitrides.

Owing to the retrodiffusion of nitrogen, the mechanical properties of the nitride layer (increased hardness, presence of residual compression constraints) are destroyed.

The deposits obtained by chromization (in the system Cr(C,N)) adhere very tightly to the substrate on account of the diffusion of the elements of the substrate into the coating with displacement of the interface. On the other hand, as a result of the high temperature treatment, they induce dimensional variations which can be crippling defects for the coated speciments.

Furthermore, this process requires the implementation of a subsequent thermal treatment to regenerate the mechanical properties at the interior of the substrate.

The low temperature deposition of chromium (OMCVD) on substrates such as silicon is, moreover, well known and described in particular by N. G. ANANTHA, V. Y. DOO and D. K. SETO in J. Electrochem. Soc., Vol. 118, No. 1 (1975), 163 with the aid of a dicumene chromium precursor (DCC).

The deposition of chromium carbide on steels is also known from the publication of J. E. KNAP, B. PETRETSKY and F. N. HILL, Plating, 53 (1966), 772.

The adhesion of the deposits thus obtained at low temperature is less than that of the process previously described (difficulty of preparation of the surface), the disadvantages of which with regard to the preservation of the dimensional qualities have already been mentioned.

The present invention makes it possible to carry out coatings such as coatings with carbides, nitrides and carbonitrides of metallic elements in the same installation.

Thus, the object of the present invention is a deposition process of a coating of the ceramic type based on carbides, nitrides or carbonitrides of metallic elements selected from Cr, V, Zr, W, Mo, Co, Mn, Ni, Hf, Ta, Ti, Nb and Fe in which the coating of the ceramic type is deposited at low temperature in the vapour phase onto a metallic substrate from organo-metallic precursors wherein, prior to this deposition in the vapour phase and without subsequent placing in contact with an oxidizing and/or polluting atmosphere, a reactive ionic pickling is carried out in a reducing atmosphere.

The reactive ionic pickling is in particular an ionic nitridation. This ionic nitridation can be carried out under a $N_2$, $H_2$ mixture, the nitrogen content of which is lower than 25% by volume, at a substrate temperature of 400° to 600° C. at a pressure lower than or equal to 1 kPa, and preferably lower than 0.5 kPa, to attain a thickness of the nitrogen diffusion layer of from 10 to 500 µm depending on the nature of the substrate.

The subsequent deposition in the vapour phase can be carried out on the substrate heated beforehand to a temperature of 300° to 700° C. in the presence of a flux of a usually inert gas vector such as Ar or He containing at least one organo-metallic precursor at a total pressure lower than 10 kPa and preferably lower than 5 kPa.

In particular, a coating with chromium carbide of formula $Cr_7C_3$ can be carried out in the vapour phase starting from optionally substituted bis arene chromiums and, in particular, from dicumene chromium or dibenzene chromium as precursors.

In addition, a coating with titanium nitrides of formula TiN can be carried out in the vapour phase starting from a precursor of the amine type, in particular tetrakis(dialkylamine) titanium of formula $Ti(NR_2)_4$ in which R is a $C_1$-$C_4$ alkyl group, and from titanium carbonitrides of formula $Ti\,N_xC$ starting from a precursor of the bipyridine type.

Similarly, a coating with zirconium nitride of formula ZrN can be carried out in the vapour phase starting from a precursor of the amine type, in particular from tetrakis(dialkylamine) zirconium of formula $Zr(NR_2)_4$ in which R is a $C_1$-$C_4$ alkyl group.

A coating with nitrides or carbonitrides of metallic elements such as Cr, V, Zr, W, Mo, Co, Mn, Ni, Hf, Ta, Ti, Nb and Fe can also be carried out starting from a system of precursors constituted simultaneously by an organo-metallic precursor of the sandwich type and a precursor of nitrogen.

The organo-metallic precursor is selected from the organo-metallic compounds of the sandwich type of the general formula:

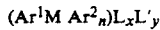

$$(Ar^1 M\ Ar^2_n) L_x L'_y$$

in which $Ar^1$ and $Ar^2$, identical or different, represent a $C_5$-$C_8$ aromatic ring optionally substituted by 1 to 6 $C_1$-$C_4$ alkyl groups or a phenyl group, n represents 0 or 1, M represents a metallic element as defined above, L and L' each represents a hydrogen atom or a halogen atom, a CO, NCO, NCS, $CF_3$, R, RCN, $PR_3$, SR, SeR group, R being a $C_1$-$C_4$ alkyl group, phenyl optionally substituted by 1 or 2 $C_1$-$C_4$ alkyl groups, pyridine, tetrahydrofuran, acetylacetonate, tetracyanoquinodimethane or L and L' represent together with M a ring $MS_4$ or $MS_5$ and x and y represent 0 to 4.

A first group of compounds of the sandwich type used are those in which the metallic element (M) is linked by means of co-ordinate bonds of the π type to two aromatic rings. In the case in which M is linked to two rings, M is situated between the planes formed by the two rings.

In this group of compounds the metal is in the zero valence state.

As examples of such compounds may be mentioned the complexes of:

chromium: $Cr(C_5H_5)_2$, $Cr(C_6H_6)_2$,
vanadium: $V(C_5H_5)_2$, $V(C_6H_6)_2$, $V(C_5H_5)(C_7H_7)$,
tungsten: $W(C_6H_6)_2$,
molybdenum: $Mo(C_6H_6)_2$),
cobalt: $Co(C_5H_5)_2$,
manganese: $Mn(C_5H_4(CH_3)_2)$, $(Mn(C_5H_5)_2)_n$ (which is a polymeric compound),
nickel: $Ni(C_5H_5)_2$, $Ni(C_8H_7(C_6H_5))_2$, (aromatic ring with 8 carbon atoms substituted by a phenyl group),
titanium: $Ti(C_5H_5)(C_7H_7)$, $Ti(C_5H_5)(C_8H_8)$,
iron: $Fe(C_5H_5)_2$, $Fe(C_5(CH_3)_5)_2$.

A second group is constituted by the compounds in which the metallic element (M) is linked, on the one hand, to one or two aromatic rings ($Ar^1$ and $Ar^2$) by means of co-ordinated $\pi$ bonds and, on the other, to ligands L and L' by means of bonds which can be covalent or co-ordinate. The number of ligands L and L' is a function of the nature of the ligand and of the nature of the metal.

As examples of compounds in which the ligands L and L' are linked by means of covalent bonds are found for:

vanadium: $V(C_5H_5)_2Cl$, $V(C_5H_5)_2(C_6H_5S)_2$, $V(C_5H_4(CH_3))_2Cl_2$,
zirconium: $Zr(C_5H_5)_2Cl_2$, $Zr(C_8H_8)Cl_2)$,
hafnium: $Hf(C_5H_5)_2(CH_3)_2$,
tantalum: $Ta(C_5H_5)_2H_3$,
tungsten: $W(C_5H_5)_2S_4$ (in which the metallic element forms a ring of 5 members with the 4 sulphur atoms,
molybdenum: $Mo(C_5H_5)Cl_2$.
titanium: $Ti(C_5H_5)_2Cl_2$, $Ti(C_5H_5)_2(C_6H_5)_2$, $Ti(C_5H_5)_2S_5$ (in which the Ti forms a ring of 6 members with 5 sulphur atoms), $Ti(C_5(CH_3)_5)_2Cl_2$, $Ti(C_5H_5)Br_3$, $Ti(C_5H_5)Cl_3$,
niobium: $Nb(C_5H_5)_2Cl_2$, $Nb(C_5H_5)H_3$, $Nb(C_6H_6)_2(CH_3)_2$.

Examples of compounds in which one or both of the ligands L and L' are linked by means of co-ordinate bonds are:

for vanadium: $V(C_5H_5)(CO)_4$, $V(C_6H_6)(CH_3CN)_3$, $V(C_7H_7)CO$,
zirconium: $Zr(C_5H_5)_2(CO)_2$, $Zr(C_5H_5)(C_5H_7O_2)_2Cl$ ($C_5H_7O_2$=acetylacetate), $Zr(C_8H_8)_2$ THF (THF=tetrahydrofuran),
hafnium: $Hf(C_5H_5)_2(CO)_2$,
tungsten: $W(C_5H_5)(C_6H_5)(CO)_3$, $W(C_7H_7)(C_6H_5Se)(CO)_2$,
molybdenum: $Mo(C_5H_5)_2(CO)_3$,
cobalt: $Co(C_5(CH_3)_5)(CO)_2$,
manganese: $Mn(C_6H_6)(CH_3CN)_3$,
nickel: $Ni(C_5H_5)(CF_3)P(C_6H_5)_3$.
titanium: $Ti(C_5H_5)_2(NCO)_2$, $Ti(C_5H_5)_2(NCS)_2$,
iron: $Fe(C_5H_5)(CH_3CH_2S)(CO)$, $Fe(C_8H_8)(CO)_3$.

The organo-metallic precursors are preferred in which the central metallic element is linked to two identical $C_5$–$C_8$ aromatic rings optionally substituted by 1 to 6 $C_1$–$C_4$ alkyl groups.

The nitrogen precursor is ammonia or hydrazine.

The deposition is carried out by chemical decomposition in the vapour phase under a pressure lower than 10 kPa at a temperature varying between 300° and 600° C.

Another object of the present invention is a tubular or flat element consisting of a metallic substrate including on at least one of its phases a coating of the ceramic type based on carbides, nitrides or carbonitrides of metallic elements such as Cr, V, Zr, W, Mo, Co, Mn, Ni, Hf, Ta, Ti, Nb deposited at a thickness of 5 to 200 $\mu$m on a nitrogen diffusion layer having a thickness of 20 to 500 $\mu$m, carried out by a process such as defined above. The metallic substrate can be, in particular, a construction steel for mechanical use, a stainless steel, a zirconium alloy or a titanium alloy.

The process according to the invention will be described below as well as an installation for its implementation in the case of a treatment comprising successively an ionic nitridation, then a coating with chromium carbide $Cr_7C_3$ obtained from dicumene chromium on the surface of tubular components. This description is given with reference to the appended drawings in which:

Figure 1:
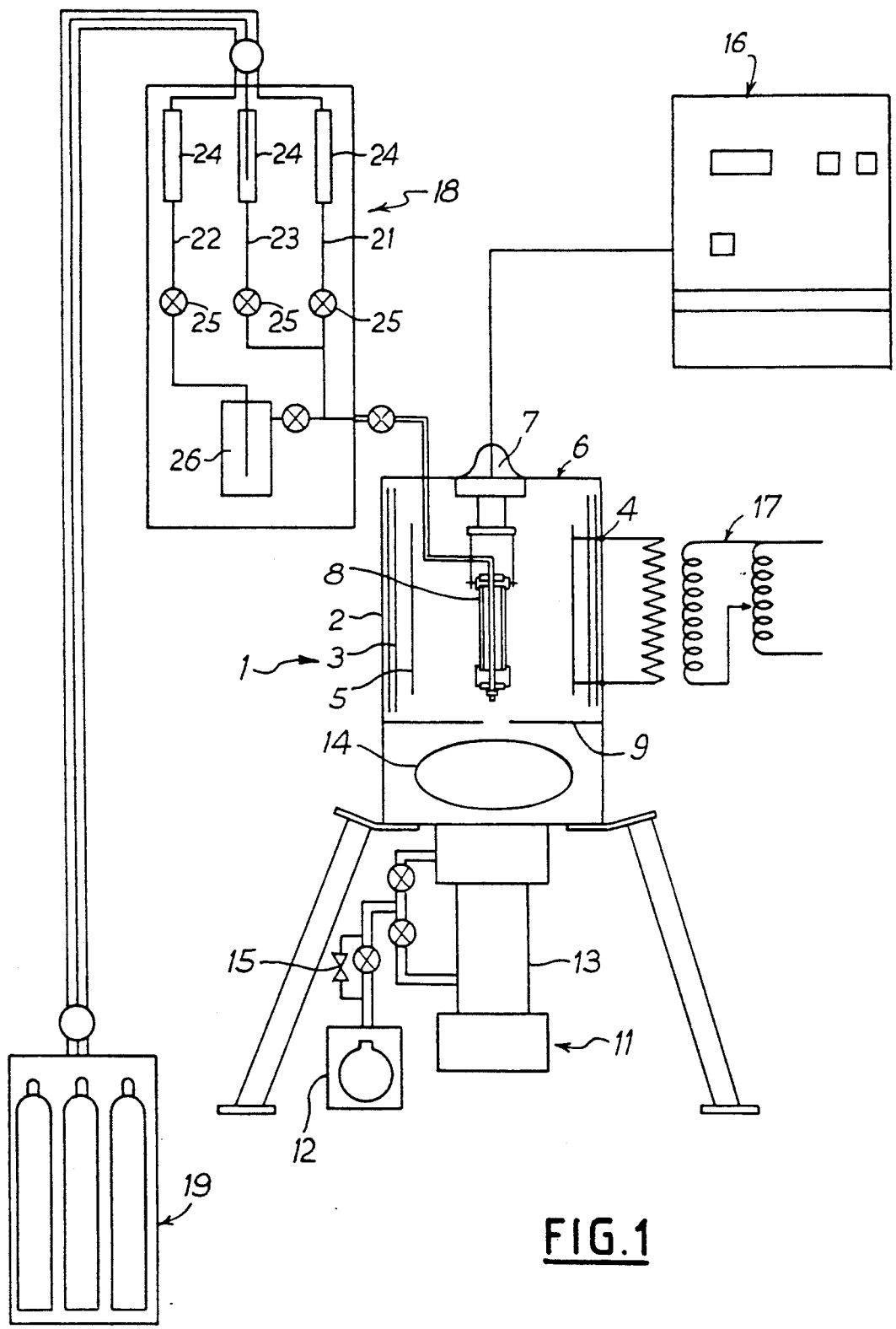
FIG. 1 represents a scheme of the entire installation used to carry out the treatment according to the invention.

A sequential description will be given of an embodiment of the installation and of the device for supplying the gases, then the application, by means of this installation and the said device, of each of the two sequences constituting the surface treatment previously defined.

DESCRIPTION OF THE INSTALLATION

The installation is mainly composed of:

a metal reactor of the mechanically welded type 1, itself consisting of a double-walled cylindrical chamber 2 equipped with protective screens against radiation 3 and with sealed and electrically insulated passages 4 for the low voltage electrical supply for the heating elements made of stainless, unfolded metal sheet 5, an upper plate with an incorporated water cooling system 6 and equipped, on the one hand, with a current lead 7 for placing the component to be treated 8 under high voltage, and, on the other, with an adequate number of tubular connecting pieces for mounting various systems for the control or measurement of the parameters of the deposition process (p, T, etc . . . ) as well as for the entry of the vector gases or reactive gases, a lower platform 9 connected to the vacuum system of the installation.

a vacuum system 11, itself consisting of a primary two stage pump 12, an oil diffusion pump 13, a liquid nitrogen trap 14, an assembly of valves for regulating the working pressure 15.

an electrical energy unit 16 which supplies a direct voltage which can be adjusted between 0 and 950 volts and a direct current varying between 0 and 360 amperes, the power supply being 420 KVA.

The electrical energy unit thus maintains the direct current supply to the reactor. It comprises a bridge connected rectifier instrument for direct or alternating current with forced commutation. The regulation of the temperature makes it possible to maintain a constant current by the intermediary of an automatic rectifier, the forced commutation leading to a rapid interruption of the current in the case of irregularity in the mode of luminescent electrical discharge.

To this energy unit is connected a control console which mainly comprises regulatory devices, the automatic systems for safety and shut down as well as the recorders.

A three-phase low voltage electrical supply 17 with adaptation of the voltage by transformer, the induced voltage between phases being 28 volts. The control of the power supplied is effected by a phase angle controlled thyristor assembly with RC protection for inductive charge.

A supply system 18 for the precursor dicumene chromium (DCC) comprising mainly a low pressure gas supply unit ($10^5$Pa) 19, three gas supply lines made of stainless steel and indicated on FIG. 1 by 21, 22 and 23, which are each equipped with a mass flowmeter 24 and valves which can be heated up to 150° C., 25. The main function of line 21 is to supply the reactor with a $N_2$—$H_2$ gas mixture during the first sequence of reactive ionic pickling, it can also be used as dilution line during the second sequence of chromium carbide deposition. Line 22 is used to conduct the DCC precursor to the reaction chamber by bubbling a vector gas, usually an inert gas, into a wash bottle 26 thermoregulated at the selected temperature and into which the precursor has initially been introduced. Line 23 makes it possible to dilute the reactive gas mixture transported by line 21 either by an inert gas, or by a reactive gas. Description of the central anode of gas admission.

Figure 2:
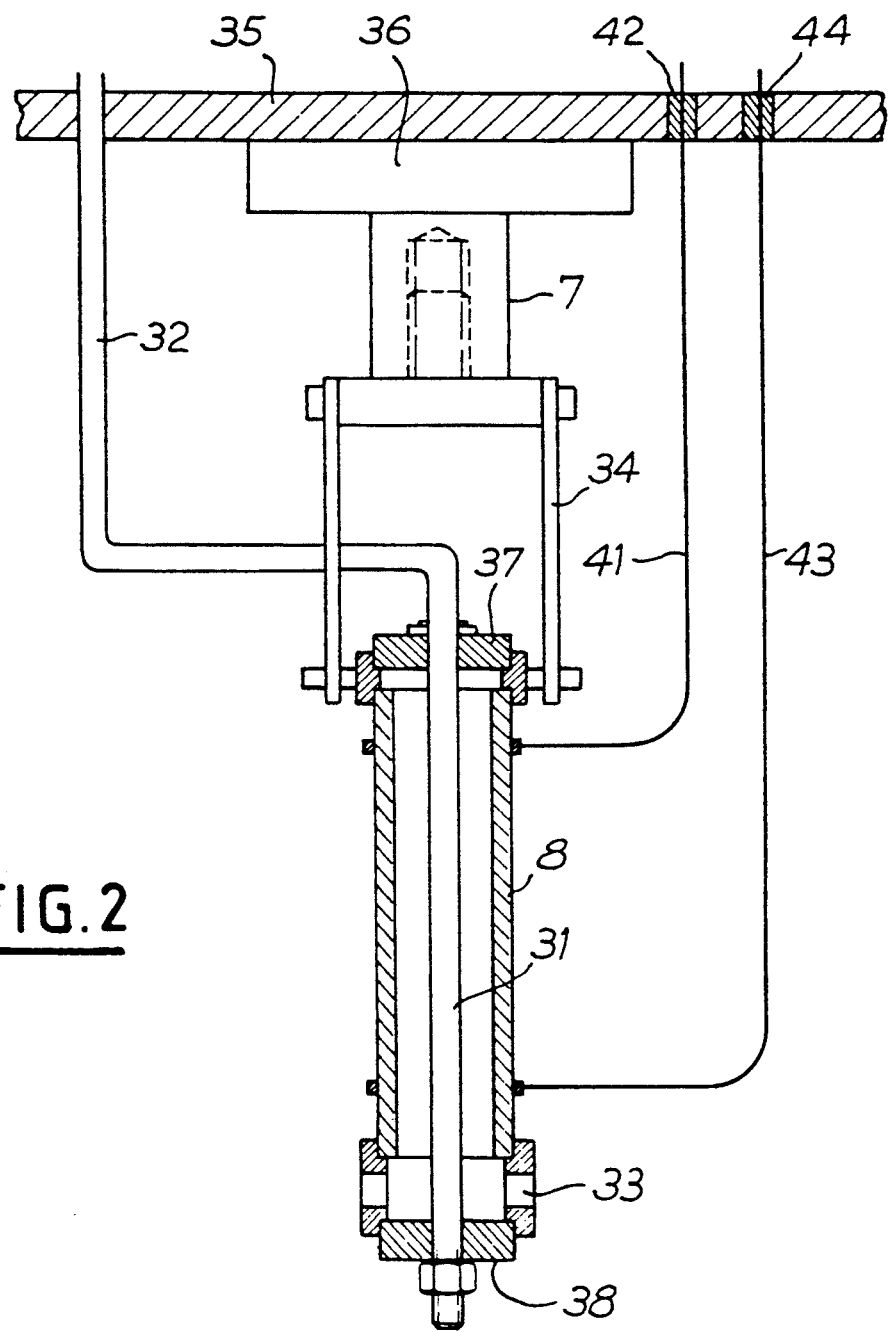
FIG. 2 represents a larger scale vertical section of the tubular component to be successively nitrided and coated with chromium carbide, its gas supply anode and the device for suspending of the latter.

In order to carry out the first sequence of reactive ionic pickling, a central anode is used such as that described in FR-A-2 446 326 which is shown in more detail in FIG. 2.

This central anode 31, of the tubular type, makes it possible to conduct the reactive gas mixture $H_2 + N_2$ to the interior of the tubular component 8. The distance between the central anode 31 and the internal surface of the tubular component 8 is constant from one extremity of the tubular component to the other and always lies between 3 and 9 millimeters, and preferably between 6 and 8 millimeters. The duct delivering the reactive gas mixture to the interior of the tubular component is shown as 32. Its distribution is assured by means of calibrated openings in a staggered arrangement and the diameter of which varies from one end of the tubular component to the other, from 1 millimeter at the inlet to 2.5 millimeters at the outlet. Additional exhaust ports for the gas mixture, shown as 33, are at a distance of 20 to 50 mm from the extremity of the tubular component, they are 3 in number, arranged at 120° on the same cross-section of the anode and their diameter is 4 millimeters. The tubular component 8 with its central anode 31 is suspended by the intermediary of a metal stirrup 34 from the current lead 7 itself attached to the upper platform of the reaction chamber 35. The current lead 7 is electrically insulated from the upper platform by means of the ceramic component represented by 36. The central anode 31 supplying the reactive gas mixture is centered on the tubular component 8 and is isolated from the latter by means of two ceramic components 37 and 38. The two thermocouples which ensure the optimal adjustment of the electrical parameters, the pressure maintained in the reaction chamber and the gas flow are represented, with their controlled device and the device providing insulation through the upper platform 35, as 41 and 42 for the regulatory thermocouple and as 43 and 44 for the control thermocouple.

The device for suspending the tubular component and the inlet for the gases to the interior of the said tubular component, previously described, is also used to carry out the second sequence of the treatment. However, for this sequence of deposition of chromium carbide, it is optionally possible to use a device enabling the central anode to be raised outside the tubular component and the supply of precursor by the upper part of the bore of the said tubular element. Description of the first sequence of the treatment.

The first sequence of the treatment, which is a sequence of reactive ionic pickling, is carried out by electrical discharge within a hydrogen-nitrogen gas mixture maintained at reduced pressure and in a voltage range which corresponds to the mode of abnormal luminescent discharge, characterized by an increase of the electrical voltage with the current density. Under these conditions of electrical discharge, created by the application between the tubular components functioning as cathode and the central anode of an electrical potential difference varying between 300 and 600 volts, the glow discharge covers the entire surface of the components to be treated in a homogeneous manner. The gaseous ions formed in the electrical discharge are accelerated in the intense field which prevails in the immediate neighbourhood of the cathode, the main part of the fall in voltage occurring in a space encompassing the cathode over a distance from about one tenth of a millimeter to several millimeters depending on the operating conditions (pressure, nature of the gas and of the metal of which the electrodes are composed), and bombard the surface of the components thus causing it to heat up to temperatures corresponding to thermo-electronic emission. Moreover, these incident ions are located at the surface of the components over several interatomic distances causing an enrichment in constituents which then diffuse into the components under the effect of temperature.

This first sequence of reactive ionic pickling uses continuously a gas mixture composed of hydrogen and nitrogen, the nitrogen content of which is advantageously less than 25% by volume. It comprises five distinct successive phases, in the following order:

a) the placing of the reaction chamber containing the tubular components and their anode under vacuum until a residual pressure lower than $10^{-2}$Pa is obtained.

b) immediately after switching off the secondary pump, introduction into the reaction chamber of the hydrogen-nitrogen mixture until a pressure of approximately 400 Pa is obtained. This adjustment of the pressure level in the reaction chamber is obtained by means of an adjustment of the power of the vacuum pumping system, which works by restricting the evacuation channel. The regulation of the pressure in the chamber to the desired value is a function of the flow rate of the gas mixture.

c) a pickling of the surface of the components by ionic bombardment under reduced pressure, lower than 80 Pa, with a slight increase in temperature less than 100° C.

d) a rise in temperature to a maximum, accompanied by a progressive increase in the pressure until the treatment pressure, included between 0.25 and 1 kPa is attained. The rise in temperature is assured by an adjustment of the electrical voltage applied to the tubular components to be treated, this voltage varying with the pressure prevailing in the reaction chamber.

e) maintainance of the maximal constant temperature under the said treatment pressure.

During this first sequence of treatment, the duration of which remains less than 50 hours, the maximal constant temperature of phase (e) lies between 400° and 600° C.

Description of the Second Sequence of Treatment

The second sequence of treatment, the object of the present invention, is intended to carry out a deposition of chromium carbide at the surface of the tubular components, the said components having been subjected beforehand during the first sequence of treatment to a superficial hardening by diffusion of the element nitrogen and/or a modification of its surface chemical reactivity. The deposition of chromium carbide is obtained by thermal decomposition of the precursor dicumene chromium placed in contact with the tubular components, previously heated to between 300° and 700° C.

This second sequence of deposition comprises three distinct phases succeeding each other in the following order:

a) transition phase during which the operations described below are successively carried out:
  switching on of the heating by resistor.
  substitution of the reactive gas mixture $H_2+N_2$ by an inert gas such as Ar, He, etc . . . , in the reaction chamber.
  abolition of the electrical plasma by switching off the high voltage generator.
  progressive adjustment of the pressure in the reaction chamber to the value for treatment, selected to be lower than 10 kPa.
  progressive adjustment of the temperature of the tubular components to the value for treatment, included between 300° and 700° C.

b) Introduction of the precursor dicumene chromium into the reaction chamber by closing the supply line 23 and simultaneously opening the supply line 22, and by maintaining the component at constant temperature under the said treatment pressure. c) a final cooling under the inert gas (closure of supply line 22 and opening of supply line 23).

In the case of the deposition process of nitrides or carbonitrides utilizing the system of precursors constituted by the organo-metallic precursor and the precursor of nitrogen, the procedure is identical except that the two precursors are simultaneously conducted into the reaction chamber by means of two supply lines.

The adjustment of the ratio of the partial pressures nitrogen precursor/organo-metallic precursor enables a coating to be obtained more or less rich in carbon or in nitrogen going from the carbonitrides to the nitrides.

A non-restrictive example will be given below of the embodiment of such a treatment sequence, reactive ionic pickling followed by the deposition of chromium carbide by thermal decomposition of the organo-metallic compound dicumene chromium inside a tubular component in an installation and by means of a device such as those just described, when this tubular component is a steel of the 32 CDV 13 type.

In the first sequence of the treatment, the reactive atmosphere used is a nitrogen-hydrogen gas mixture containing 2% by volume of nitrogen. The operation comprises five distinct phases:
  evacuation of the reaction chamber containing the tubular components and their anode until the residual pressure level is less than $10^{-3}$ Pa.
  introduction into the chamber of a nitrogen-hydrogen mixture containing 2% by volume of nitrogen
  pickling under reduced pressure, less than 80 Pa, of the nitrogen-hydrogen mixture with 2% by volume of nitrogen, accompanied by a slight rise in temperature, less than 100° C. within a time of about 2 hours
  a rise in temperature, accompanied by a progressive increase in pressure until the treatment pressure of 400 Pa is attained, this rise in temperature being brought about in a period of about 3 hours
  maintainance of the temperature between 480° and 485° C. for a period of about 1 hour if only a modification of the chemical reactivity of the surface of the tubular component of 150 mm minimal length is required, and of about 40 hours if in addition it is desired to carry out a superficial hardening of the substrate by a diffusion phenomenon in the solid state of the element nitrogen (creation of a nitrogen diffusion layer without a compound superficial substratum).

In the second sequence of treatment a thickness of about 10 μm of chromium carbide $Cr_7C_3$ is deposited on the tubular component, the surface chemical reactivity of which has been modified beforehand and the metallic substrate of which has been hardened beforehand by the phenomenon of diffusion in the solid state of the element nitrogen employed in the first sequence of treatment. This second sequence of treatment is carried out in the following four successive phases:

a transition phase during which the following operations are successively carried out:
  1°) Switch on the heating by radiation (elements 5).
  2°) Substitution of the reactive gas mixture of hydrogen-nitrogen with 2% nitrogen by the inert gas helium (closure of supply line 21 and opening of supply line 23).
  3°) Abolition of the electrical plasma (switching off of H.T. generator 16) 4°) Adjustment of the pressure in the reaction chamber to 270 Pa (adjustment of the pumping rate with the aid of the valve 15) and simultaneously progressive adjustment of the temperature of the tubular component to 510°/515° C.

Delivery into the deposition chamber, by closing supply line 23 and simultaneously opening supply line 22, of the precursor dicumene chromium by bubbling helium gas into a saturator containing the said precursor and which had been heated beforehand to 110°/120° C. (by means of a thermostatted oil bath) and the placing in contact of this precursor with the internal surface of the tubular component thermally equilibrated beforehand to the temperature of 510°/515° C.

Maintainance of the tubular component for a period of two to three hours at a constant temperature of 510°/515° C. under a constant pressure of 270 Pa of the reactive mixture helium-dicumene chromium.

Final cooling under helium (closure of supply line 22 and simultaneous opening of supply line 23, then switching off of the heating by radiation).

Under these conditions of treatment it is possible to form on the internal surface of the tubular component made of 32 CDV 13 steel a coating constituted by:

A homogeneous nitrogen diffusion internal substratum having the following characteristics: minimal nitrided depth equal to 150 μm according to the Vickers microhardness criterion Hv 0.1>(Hv 0.1 (metal before treatment)+100); maximal Vickers superficial microhardness Hv 0.1>700.

A compact external substratum of uniform thickness equal to 10 μm, formed of the $Cr_7C_3$ phase of hexagonal structure characterized by a Vickers superficial microhardness of approximately 2000 Hv 0.1.

For comparative purposes and with a view to demonstrating the value of carrying out a first sequence of reactive ionic pickling (ionic nitridation) before deposition of a coating of chromium carbide, scratch tests with the aid of equipment of the REVETEST type and thermal fatigue tests were carried out respectively on a substrate of 32CDV13 steel coated with chromium carbide $Cr_7C_3$ obtained in the crystalline state and on the same 32CDV13 substrate successively nitrided by the ionic approach and coated with chromium carbide $Cr_7C_3$ obtained in the crystalline state; in both cases the thickness of the chromium carbide coating being approximately 10 μm and the substrate being in the tempered state.

The scratch test consists of scratching the coated surface by means of a conic diamond stylus of the Rockwell c type, the angle of the cone being 120° and terminated by a radius of curvature of 200 μm, on which is exerted an increasing load, and of detecting the acoustic emission produced by the damage (fracturing, flaking, . . .) of the coating. The equipment used of the REVETEST type was developed by the Laboratoire Suisse de Recherches Horlogères (L.S.R.M.). It enables scratch tests to be performed in the automatic mode, i.e. it permits the load applied to the stylus to be increased in a constant manner during scratching; the rates of displacement of the coated sample and the rates of variation of the applied load being fixed before the test. In this test, an abrupt change left by the tip of the stylus on the coated sample constitutes a criterion of rupture of the adhesion between the coating and the substrate. The appearance of this critical load can then be described in the following manner:

under the action of an extremely light load, the tip of the stylus only marks the deposit and causes no appreciable deformation of the substrate. Under these conditions, the tip marks on the sample a very fine straight line with a regular edge.

if the applied load is increased progressively, there is plastic deformation of the substrate and the appearance of shear stresses at the interface between the coating and the substrate. The progressive deformation of the coating can lead to the presence of fractures in the zones extending from this latter, i.e. zones near to the zone stressed by the indentation (edges of the imprint). Depending on the tenacity and adhesion of the coating the following may occur:

either an abrupt widening of the trace (yielding of the substrate)

or the appearance of periodic patents along the latter (plastic deformation of the substrate with the development of fractures in the coating which are expressed by microflakings or flakings depending on the adhesion of the coating to the substrate).

These observations lead to a definition of the response criteria associated with the adhesion of the deposit which are as follows:

initial load of fracture of the coating at the bottom of the indentation, load leading to microflakings at the edge of the indentation, load leading to collapse of the substrate with splitting and incrustation of the coating at the bottom of the indentation.

The results of the scratch tests presented in Table I demonstrate the noticeable improvement obtained with regard to the adhesive properties of the chromium carbide coating: $Cr_7C_3$ formed by thermolysis of dicumene chromium, when it is carried out on a substrate nitrided beforehand by the ionic approach, i.e. carried out according to the sequence of treatment described in the present invention.

TABLE I

Comparative scratch tests on 32CDV13 steel coated with chromium carbide $Cr_7C_3$

| Surface treatment | Initial fracture load of $Cr_7C_3$ coating at the bottom of the indentation | Initial microflaking load at edge of the indentation | Load leading to collapse of substrate with splitting and incrustation of coating at the bottom of the indentation |
|---|---|---|---|
| Ionic nitridation + $Cr_7C_3$ coating (thickness: 10 μm) | 30 N | | 50 N |
| $Cr_7C_3$ coating alone (thickness: 10 μm) | 0 N | 20 N | 20 N |

We claim:

1. A process for the chemical vapor deposition of a ceramic coating on a metallic substrate, which process comprises the steps of:
   subjecting the metallic substrate to a reactive ionic nitridation by contacting the metallic substrate with a reducing atmosphere containing nitrogen at a substrate temperature of 400° to 600° C., without subsequently placing the metallic substrate in contact with an oxidizing and/or polluting atmosphere, to form a nitrogen diffusion layer having a thickness of from 20 to 500 μm;
   heating the metallic substrate to a temperature of 300° C. to 700° C.;
   contacting the heated metallic substrate with at least one organo-metallic precursor in a vapor phase to deposit the coating on the metallic substrate, and the coating comprised of carbides, nitrides or carbonitrides of metallic elements selected from the group consisting of Cr, V, Zr, W, Mo, Co, Mn, Ni, Hf, Ta, Ti, Nb and Fe.

2. Process according to claim 1, wherein the reducing atmosphere containing nitrogen comprises a $N_2+H_2$ mixture, the nitrogen content of which is lower by 25% by volume, and a pressure of the reducing atmosphere is lower than or equal to 1 kPa.

3. Process according to claim 1, wherein during the deposition the substrate is heated to a temperature of 300° to 700° C. in the presence of a flux of a gas selected from the group consisting of Ar and He containing the at least one organo-metallic precursor at a total pressure lower than 10 kPa.

4. Process according to claim 1, wherein a coating of chromium carbide of formula $Cr_7C_3$ is deposited in the vapor phase by using optionally substituted bis arene chromiums as a precursor.

5. Process according to claim 1, wherein a coating of chromium carbide of formula $Cr_7C_3$ is deposited in the vapor phase by using dicumene chromium as a precursor.

6. Process according to claim 1, wherein a coating of chromium carbide of formula $Cr_7C_3$ is deposited in the vapor phase by using dibenzene chromium as a precursor.

7. Process according to claim 1, wherein a coating of chromium carbide of formula $Cr_7C_3$ is deposited in the vapor phase by using bis(cyclopentadienyl) chromium as a precursor.

8. Process according to claim 1, wherein a coating of nitrides or carbonitrides of metallic elements selected from the group consisting of Cr, V, Zr, W, Mo, Co, Mn, Ni, Hf, Ta, Ti, Nb and Fe is deposited in the vapor phase by using a precursor system comprising simultaneously
(A) an organo-metallic precursor of the metallic element selected from organo-metallic compounds of the general formula $$(Ar^1M\ Ar^2{}_n)L_xL'_y$$

in which $Ar^1$ and $Ar^2$, identical or different, represent a $C_5$-$C_8$ aromatic ring optionally substituted by 1 to 6 $C_1$-$C_4$ alkyl groups or a phenyl group, n represents 0 or 1, M represents a the metallic element, L and L' each represents a hydrogen atom or a halogen atom, a CO, NCO, NCS, $CF_3$, R, RCN, $PR_3$, SR and SeR group, R being a $C_1$-$C_4$ alkyl group or a phenyl group optionally substituted by 1 or 2 $C_1$-$C_4$ alkyl groups, pyridine, tetrahydrofuran, acetylacetonate, tetracyanoquinodimethane or L and L' represent together with M a ring $MS_4$ or $MS_5$ and x+y represent 0 to 4 and
(B) a nitrogen precursor selected from ammonia and hydrazine.

9. Process according to claim 8, wherein the organo-metallic precursor is selected from the compounds in which the central metallic element is linked to two identical $C_5$-$C_8$ aromatic rings, optionally substituted by one to six $C_1$-$C_4$ alkyl groups.

10. Process according to claim 9, wherein the metallic element is chromium and the organo-metallic precursor is selected from the group consisting of dibenzene chromium, the bis arene chromiums substituted by one to six $C_1$-$C_4$ alkyl groups and bis (cyclopentadienyl) chromium.

11. Process according to claim 3 wherein the total pressure is lower than 5 kPa.

12. Process according to claim 2 wherein the pressure of the $N_2+H_2$ mixture is lower than 0.5 kPa.

* * * * *